(12) United States Patent
Brissenden et al.

(10) Patent No.: US 10,339,243 B2
(45) Date of Patent: Jul. 2, 2019

(54) METHOD AND APPARATUS FOR AUTOMATIC HIERARCHICAL DESIGN PARTITIONING

(71) Applicant: Altera Corporation, San Jose, CA (US)

(72) Inventors: Scott James Brissenden, Toronto (CA); Paul McHardy, Toronto (CA)

(73) Assignee: ALTERA CORPORATION, San Jose, CA (US)

( * ) Notice: Subject to any disclaimer, the term of this patent is extended or adjusted under 35 U.S.C. 154(b) by 0 days.

(21) Appl. No.: 15/909,844

(22) Filed: Mar. 1, 2018

(65) Prior Publication Data

US 2018/0189427 A1 Jul. 5, 2018

Related U.S. Application Data

(60) Continuation of application No. 14/448,209, filed on Jul. 31, 2014, now Pat. No. 9,922,156, which is a division of application No. 13/553,995, filed on Jul. 20, 2012, now Pat. No. 8,832,618, which is a division of application No. 12/587,064, filed on Oct. 1, 2009, now Pat. No. 8,255,847.

(51) Int. Cl.
*G06F 17/50* (2006.01)
*G06F 8/70* (2018.01)

(52) U.S. Cl.
CPC ........ *G06F 17/505* (2013.01); *G06F 17/5045* (2013.01); *G06F 17/5054* (2013.01); *G06F 8/70* (2013.01); *G06F 17/5072* (2013.01); *G06F 17/5077* (2013.01)

(58) Field of Classification Search
CPC ............... G06F 17/505; G06F 17/5054; G06F 17/5045; G06F 17/5077; G06F 17/5072; G06F 8/70
See application file for complete search history.

(56) References Cited

U.S. PATENT DOCUMENTS

| | | | | | |
|---|---|---|---|---|---|
| 4,967,367 | A | * | 10/1990 | Piednoir | G06F 17/5045 716/102 |
| 4,983,959 | A | * | 1/1991 | Breuninger | H03K 19/1735 326/38 |
| 5,036,473 | A | * | 7/1991 | Butts | G06F 15/7867 703/16 |
| 5,128,871 | A | * | 7/1992 | Schmitz | G06F 17/5054 716/102 |
| 5,448,493 | A | * | 9/1995 | Topolewski | G06F 17/5054 716/117 |
| 5,541,849 | A | * | 7/1996 | Rostoker | G01R 31/31704 714/E11.167 |
| 5,574,655 | A | * | 11/1996 | Knapp | G06F 17/5054 716/104 |
| 5,618,744 | A | * | 4/1997 | Suzuki | G06F 17/5068 257/E27.105 |
| 5,640,327 | A | * | 6/1997 | Ting | G06F 17/5072 716/121 |

(Continued)

*Primary Examiner* — Naum Levin
(74) *Attorney, Agent, or Firm* — Fletcher Yoder, P.C.

(57) ABSTRACT

A method for designing a system on a target device is disclosed. The system is synthesized. The system is partitioned into a plurality of logical sections utilizing information derived from synthesizing the system and prior to performing placement of the system on the target device. Other embodiments are described and claimed.

23 Claims, 11 Drawing Sheets

(56) References Cited

U.S. PATENT DOCUMENTS

| | | | | |
|---|---|---|---|---|
| 5,648,913 | A * | 7/1997 | Bennett | G06F 17/5031 716/113 |
| 5,659,716 | A * | 8/1997 | Selvidge | G06F 17/5027 326/41 |
| 5,761,484 | A * | 6/1998 | Agarwal | G06F 17/5027 326/38 |
| 5,778,216 | A * | 7/1998 | Venkatesh | G06F 17/5031 713/500 |
| 5,801,958 | A * | 9/1998 | Dangelo | G01R 31/31704 716/102 |
| 5,854,752 | A * | 12/1998 | Agarwal | G06F 17/5027 716/116 |
| 5,983,277 | A * | 11/1999 | Heile | G01R 31/3177 709/215 |
| 6,035,106 | A * | 3/2000 | Carruthers | G06F 17/5054 703/1 |
| 6,038,386 | A * | 3/2000 | Jain | G06F 17/5054 716/113 |
| 6,080,204 | A * | 6/2000 | Mendel | G06F 17/5054 716/103 |
| 6,097,212 | A * | 8/2000 | Agrawal | H03K 19/1737 326/38 |
| 6,130,551 | A * | 10/2000 | Agrawal | G06F 17/5054 326/101 |
| 6,145,117 | A * | 11/2000 | Eng | G06F 17/5045 716/105 |
| 6,163,168 | A * | 12/2000 | Nguyen | H03K 19/17736 326/39 |
| 6,189,131 | B1 * | 2/2001 | Graef | G06F 17/5045 716/113 |
| 6,195,788 | B1 * | 2/2001 | Leaver | G06F 17/5054 716/116 |
| 6,249,902 | B1 * | 6/2001 | Igusa | G06F 17/5072 716/123 |
| 6,295,636 | B1 * | 9/2001 | Dupenloup | G06F 17/5045 716/103 |
| 6,301,694 | B1 * | 10/2001 | Lee | G06F 17/5072 716/117 |
| 6,367,063 | B1 * | 4/2002 | Harding | G06F 15/7867 326/38 |
| 6,400,180 | B2 * | 6/2002 | Wittig | H03K 19/1737 326/38 |
| 6,467,074 | B1 * | 10/2002 | Katsioulas | G06F 15/7867 257/207 |
| 6,493,863 | B1 * | 12/2002 | Hamada | G06F 17/5045 716/102 |
| 6,532,583 | B1 * | 3/2003 | Shibuya | G06F 17/5077 716/114 |
| 6,543,032 | B1 * | 4/2003 | Zolotykh | G06F 17/505 326/41 |
| 6,557,145 | B2 * | 4/2003 | Boyle | G06F 17/505 716/105 |
| 6,711,729 | B1 * | 3/2004 | McElvain | G06F 17/5045 716/105 |
| 6,738,960 | B2 * | 5/2004 | Teig | G06F 17/5072 716/113 |
| 6,763,510 | B2 * | 7/2004 | Tanaka | G06F 17/505 716/122 |
| 6,836,877 | B1 * | 12/2004 | Dupenloup | G06F 17/5045 716/103 |
| 7,003,738 | B2 * | 2/2006 | Bhattacharya | G06F 17/505 716/102 |
| 7,017,043 | B1 * | 3/2006 | Potkonjak | G06T 1/0021 713/176 |
| 7,047,163 | B1 * | 5/2006 | Chakraborty | G06F 17/5045 703/2 |
| 7,080,365 | B2 * | 7/2006 | Broughton | G06F 8/427 703/15 |
| 7,107,568 | B2 * | 9/2006 | Cronquist | G06F 17/5045 716/103 |
| 7,131,078 | B1 * | 10/2006 | Maheshwari | G06F 17/5022 716/104 |
| 7,155,708 | B2 * | 12/2006 | Hammes | G06F 17/5022 717/155 |
| 7,171,633 | B1 * | 1/2007 | Hwang | G06F 17/505 716/103 |
| 7,194,723 | B1 * | 3/2007 | Hwang | G06F 15/7867 716/117 |
| 7,224,185 | B2 * | 5/2007 | Campbell | G06F 9/38 326/46 |
| 7,257,800 | B1 * | 8/2007 | Singh | G06F 17/5054 716/116 |
| 7,386,822 | B1 * | 6/2008 | Hu | G06F 17/5072 257/E27.108 |
| 7,398,486 | B2 * | 7/2008 | Galatenko | G06F 17/5077 716/103 |
| 7,409,663 | B2 * | 8/2008 | Rouch | G06F 17/509 716/102 |
| 7,509,618 | B1 * | 3/2009 | Hutton | G06F 17/5027 716/104 |
| 7,610,573 | B1 * | 10/2009 | Chan | G06F 17/5054 716/104 |
| 7,669,157 | B1 * | 2/2010 | Borer | G06F 17/505 703/22 |
| 7,743,354 | B2 * | 6/2010 | Albrecht | G06F 17/5031 716/113 |
| 7,805,697 | B2 * | 9/2010 | Wood | G06F 17/5036 716/113 |
| 7,904,848 | B2 * | 3/2011 | Coene | G06F 9/5066 716/111 |
| 8,136,076 | B2 * | 3/2012 | Bachina | G06F 17/5054 716/101 |
| 8,201,125 | B1 * | 6/2012 | Jang | G06F 17/5054 716/104 |
| 8,225,259 | B1 * | 7/2012 | Mendel | H03K 19/177 716/116 |
| 8,370,776 | B1 * | 2/2013 | Chan | G06F 17/505 716/105 |
| 8,381,142 | B1 * | 2/2013 | Hutton | G06F 17/5054 716/100 |
| 8,489,797 | B2 * | 7/2013 | Hegde | G06F 9/45533 710/316 |
| 8,504,978 | B1 * | 8/2013 | Bhardwaj | G06F 17/5036 716/106 |
| 2002/0157075 | A1 * | 10/2002 | Teig | G06F 17/5072 716/122 |
| 2003/0037319 | A1 * | 2/2003 | Narang | G06F 17/5022 717/144 |
| 2004/0049672 | A1 * | 3/2004 | Nollet | G06F 15/7867 713/100 |
| 2004/0158807 | A1 * | 8/2004 | Hossain | G06F 17/505 716/103 |
| 2005/0204316 | A1 * | 9/2005 | Nebel | G06F 17/5022 716/103 |
| 2005/0278680 | A1 * | 12/2005 | Mukherjee | G06F 17/5054 716/105 |
| 2006/0005173 | A1 * | 1/2006 | Eng | G06F 17/5022 717/140 |
| 2007/0150846 | A1 * | 6/2007 | Furnish | G06F 17/5068 716/122 |
| 2007/0234257 | A1 * | 10/2007 | Pandey | G06F 17/5072 716/105 |
| 2008/0028347 | A1 * | 1/2008 | Hiraoglu | G06F 17/504 716/103 |
| 2009/0031277 | A1 * | 1/2009 | McElvain | G06F 17/505 716/104 |
| 2009/0219051 | A1 * | 9/2009 | Zhang | H03K 19/17752 326/38 |
| 2010/0218146 | A1 * | 8/2010 | Platzker | G06F 17/505 716/103 |

\* cited by examiner

METHOD AND APPARATUS FOR AUTOMATIC HIERARCHICAL DESIGN PARTITIONING

CROSS-REFERENCE TO RELATED APPLICATIONS

This application is a continuation of U.S. patent application Ser. No. 14/448,209 filed on Jul. 31, 2014, entitled "Method And Apparatus For Automatic Hierarchical Design Partitioning", now U.S. Pat. No. 9,922,156, which issued on Mar. 20, 2018, which is a divisional of and claims priority and benefit to U.S. application Ser. No. 13/553,995 filed on Jul. 20, 2012, entitled, "Method And Apparatus For Automatic Hierarchical Design Partitioning", which issued as U.S. Pat. No. 8,832,618 on Sep. 9, 2014, which is a divisional of and claims priority and benefit to U.S. application Ser. No. 12/587,064 filed on Oct. 1, 2009, which issued as U.S. Pat. No. 8,255,847 on Aug. 28, 2012, entitled "Method And Apparatus For Automatic Hierarchical Design Partitioning," each of which is incorporated by reference herein in their entirety for all purposes.

FIELD

Embodiments of the present invention relate to electronic design automation (EDA) tools. More specifically, embodiments of the present invention relate to a method and apparatus for performing automatic hierarchical design partitioning.

BACKGROUND

Electronic designs for large systems may include millions of gates and megabits of embedded memory. Of the tasks required in managing and optimizing electronic designs on a target device, synthesis, placement, and routing utilizing available resources can be among the most challenging and time consuming. The complexity of large systems often requires the use of electronic design automation (EDA) tools to manage and optimize designs. EDA tools perform the time-consuming tasks of synthesis, placement, and routing on a target device.

The physical design process of modern high-density, high performance digital circuits in field programmable gate arrays (FPGAs) or application specific integrated circuits (ASICs) technologies requires the ability to iterate rapidly during design and debugging stages. State of the art designs which integrate together hundreds of design modules may require many hours of time to compile. Since designs are recompiled frequently during development and debugging, it is highly desirable to reduce compilation times. Additionally, EDA tools use heuristic algorithms that can produce different results given a different set of conditions. This is known as the "seed effect". To mitigate this seed effect, which can cause large variations in circuit quality, designers often compile the same version of their design multiple times using slightly different input conditions to meet performance requirements.

EDA tools have responded to these challenges by integrating incremental design features into their computer aided design (CAD) flows. Incremental design reuses results from previous compilation for unmodified portions of the design. Incremental design can reduce overall design time by 1) speeding up individual compilation, and 2) preserving the performance of unmodified portions of the design.

In order to perform incremental design, an existing design must be divided into partitions. For many EDA tools, dividing a system design into partitions is done manually by the designer. Since modern designs may have hundreds or thousands of modules to partition, the task of partitioning a design could be time consuming for a designer. In addition, poor partitioning choices can degrade circuit quality significantly and often negates the benefits of using incremental design.

BRIEF DESCRIPTION OF THE DRAWINGS

The features and advantages of embodiments of the present invention are illustrated by way of example and are not intended to limit the scope of the embodiments of the present invention to the particular embodiments shown.

SUMMARY

According to an exemplary embodiment of the present invention, a method and apparatus is used to automatically partition a system design into a plurality of logical sections to enable use of incremental design procedures. A partitioning strategy is used which utilizes information obtained from one or more procedures from a previous compilation of the system design without requiring a complete compilation of the system design to be performed first. When determining whether to include a module into a partition, the partitioning strategy may consider a module's connectivity to other modules, the size of module as impacted by optimization foregone by partitioning, the impact of recompilation required, likely placement of the module relative to other modules, and other criteria. According to an embodiment of the present invention, a user may adjust the partitioning strategy used by a partition unit on an EDA tool based upon design objectives.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
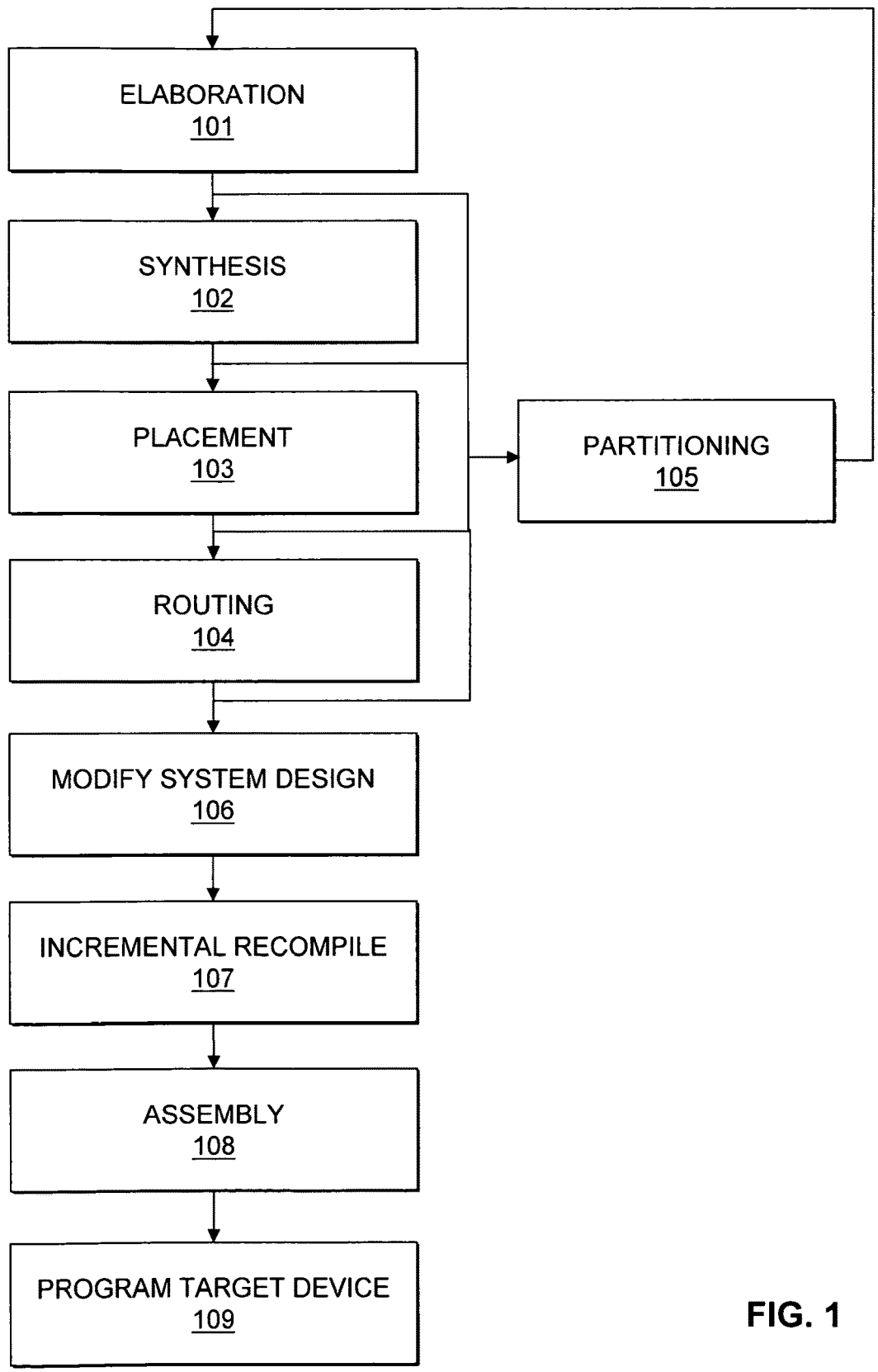
FIG. 1 is a flow chart illustrating a method for designing a system according to an exemplary embodiment of the present invention.

FIG. 1 is a flow chart illustrating a method for designing a system on a target device according to an exemplary embodiment of the present invention. The target device may be an FPGA, ASIC, a structured ASIC, or other device. According to one embodiment, the procedure illustrated in FIG. 1 may be performed by an EDA tool implemented on a computer system. At 101, elaboration is performed on design information that is inputted. According to an embodiment of the present invention, design information that describes the behavior of the system and constraints to guide the system's implementation are read during elaboration. The design information may include program files in hardware description language (HDL) or other format. The constraints may include timing requirements, circuit operating conditions, placement and routing constraints, and other constraints. According to an embodiment of the present invention, elaboration involves verifying the correctness of the design information. This may include syntax checking of the design information and constraints. The output of elaboration may include an unoptimized register transfer level (RTL) implementation of the system that will be refined during subsequent procedures in the flow.

At 102, the system is synthesized. Synthesis includes generating a logic design of the system to be implemented. According to an embodiment of the present invention, synthesis generates an optimized logical representation of the system from the HDL design definition. The optimized logical representation of the system may include a representation that has a minimized number of functional blocks and registers, such as logic gates and logic elements, required for the system. Synthesis also includes mapping the optimized logic design (technology mapping). Mapping includes determining how to implement logic gates and logic elements in the optimized logic representation with resources (components) available on the target device. According to an embodiment of the present invention, a netlist is generated from mapping. This netlist may be an optimized technology-mapped netlist generated from the HDL.

At 103, the mapped logical system design is placed. Placement works on the optimized technology-mapped netlist to produce a placement for each of the functional blocks. According to an embodiment of the present invention, placement includes fitting the system on the target device by determining which components on the logic design are to be used for specific logic elements, and other function blocks determined to implement the system as determined during synthesis. Placement may include clustering which involves grouping logic elements together to form the logic clusters present on the target device.

At 104, the placed design is routed. During routing, routing resources on the target device are allocated to provide interconnections between logic gates, logic elements, and other components on the target device. Routability optimization may also be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 105, the system design is divided into partitions. According to an embodiment of the present invention, a partition is a logical section that includes one or more design modules that are grouped together. A design module may include one or more components. Partitioning may be performed after one or more of the elaboration 101, synthesis 102, placement 103, and routing 104 procedures where the partitioning utilizes information from one or more of the procedures. Information utilized from the one or more procedures may include approximate device resource counts, timing criticality, design hierarchy, mapping of design source file to design modules, and other information. It should be appreciated that the partitioning procedure may be performed after any one of the procedures 101-104 and that the partitioning procedure need not wait for the routing procedure to be completed prior to performing partitioning. Each partition is subsequently compiled separately from other partitions when performing subsequent synthesis, placement, and routing procedures on the partitioned design. As shown, after partitioning is performed at 105, control returns to procedure 101. It should be appreciated that the partitioning procedure 105 may be performed again after one or more of the elaboration 101, synthesis 102, placement 103, and routing 104 procedures. The partitioning procedure 105 may be performed for several predetermined iterations or until a specific quality of partition is achieved.

According to an embodiment of the present invention, each partition may also be floorplanned. In this embodiment, one or more logical sections created during partitioning may have a size and location on the target device assigned to it. It should be appreciated that partitioning and floorplanning may operate together where partitioning is performed with input from floorplanning and floorplanning is performed with input from partitioning in order to refine and improve partitioning and floorplanning decisions.

According to an embodiment of the present invention, a strategy for partitioning the system design is implemented to include the following objectives in order to generate partitions having a good quality value. First, partitions are generated that are loosely coupled with the rest of the system design. The number of intra-partition paths between the partition and other parts of the design is small relative to the size of the partition. A loosely coupled partition may have fewer cross-boundary synthesize optimizations that are prevented. Second, partitions have registered input and output ports. Third, the creation of a partition should not degrade circuit quality substantially due to the prevention of cross-boundary logic synthesis optimizations. Fourth, the size of a partition should not be too small or too big relative to the overall size of the design. Fifth, the partition should work well when assigned to a physical region. The timing requirements and routability of the design should not suffer substantially when the partition is floorplanned. Sixth, design regularity is desirable when replicating modules for more than one partitions. Seventh, fewer critical input and output ports at the boundary of partitions are desired.

Figure 2:
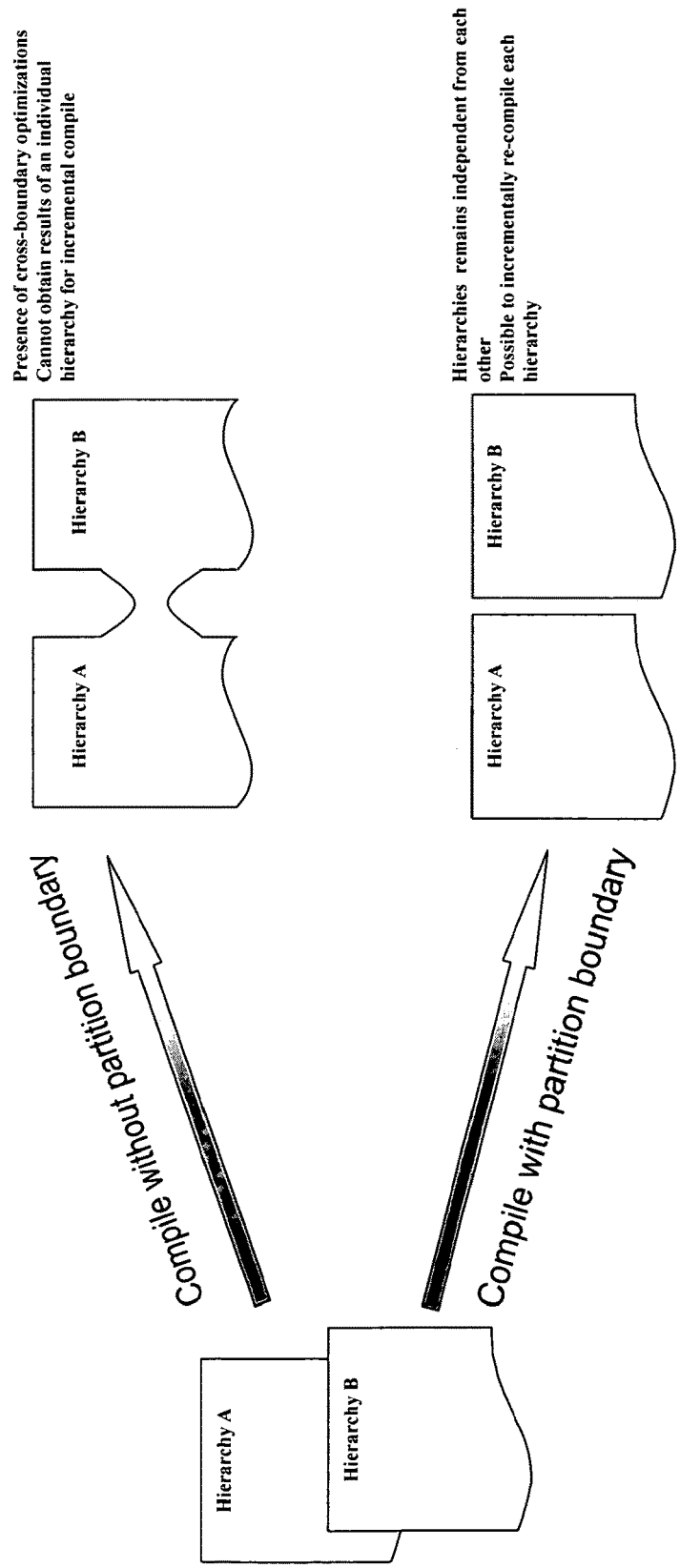
FIG. 2 illustrates the effects of partition boundary according to an exemplary embodiment of the present invention.

FIG. 2 illustrates the effects of partitioning. To facilitate incremental compilation of partitions, optimizations across partition boundaries are typically prohibited. By prohibiting cross-boundary optimizations, compilation results for unmodified partitions may be reused.

Figure 3A:
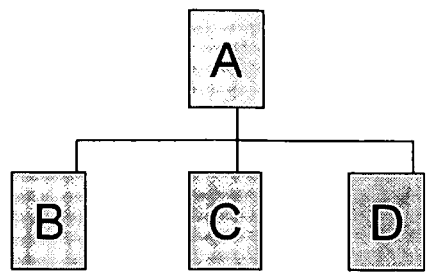
FIGS. 3a-3c illustrate an example of modules in a system design and examples of logical partitions according to exemplary embodiments of the present invention.
Figure 3B:
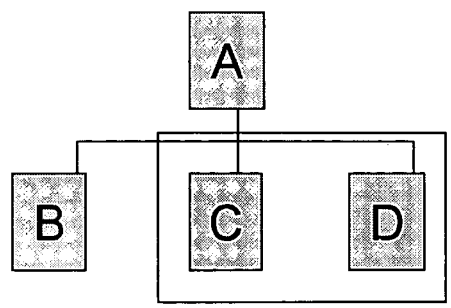
Figure 3C:
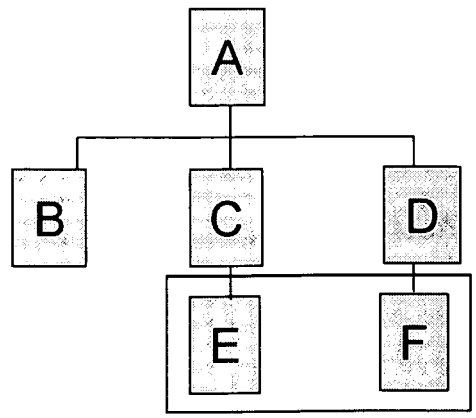

According to an embodiment of the present invention, a partition can group any one or more modules in a system design, but may also be subject to certain rules. For example, logical partitions may be required to be rooted at a module boundary. FIG. 3a illustrates an exemplary module hierarchy. In FIG. 3a, there are four legal logical partitions, each rooted at one of the modules in the hierarchy. Siblings in a design hierarchy may be grouped together into a partition that does not include a common parent module as illustrated in FIG. 3b. Design modules that do not share a common hierarchy may also be grouped together in a partition as illustrated in FIG. 3c. It should be appreciated that the partitioning procedure illustrated in FIG. 1 is capable of making design partitions that must be rooted at a module hierarchy and could be expanded to support the examples illustrated in FIGS. 3b and 3c.

Referring back to FIG. 1, at 106, a modification to the system design is made. According to an embodiment of the present invention, one or more modules in one or more of the partitions generated at 105 is modified.

At 107, incremental recompilation is performed. According to an embodiment of the present invention, incremental recompilation involves performing elaboration, synthesis, placement, and routing on only partitions that have been modified.

At 108, an assembly procedure is performed. The assembly procedure involves creating a data file that includes information determined by the compilation procedure described by 101-107. The data file may be a bit stream that may be used to program a target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

At 109, the target device is programmed with the data file. By programming the target with the data file, components on the target device are physically transformed to implement the system. According to an embodiment of the present invention where the target device is an ASIC or other target device other than an FPGA, procedures 108 and 109 may not be performed.

Figure 4:
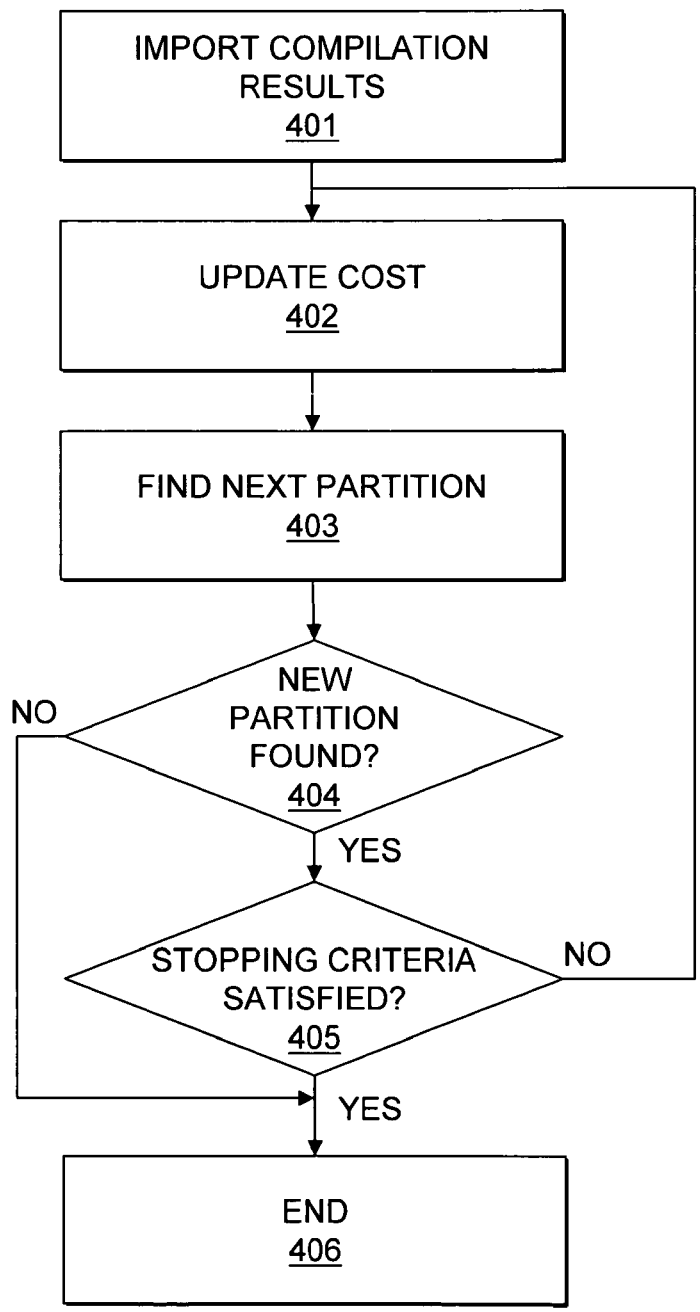
FIG. 4 is a flow chart illustrating a method for performing hierarchical design partitioning according to an exemplary embodiment of the present invention.

FIG. 4 is a flow chart illustrating a method for performing hierarchical design partitioning according to an exemplary embodiment of the present invention. The procedure illustrated in FIG. 4 may be implemented at 105 in FIG. 1. The methodology illustrated in FIG. 4 iteratively identifies partitions. For each given iteration, legal design partition candidates are ranked and the best one is selected. Partitions are ranked using a weighted set of partitioning costs. Partitioning costs may be evaluated dynamically based on characteristics of a candidate partition extracted by blending previous compilation results with optimization goals an information about partitioning decisions made on previous iterations. At 401, compilation results from a design compilation procedure previously performed are imported. According to an embodiment of the present invention, the compilation results may be obtained from elaboration, synthesis, placement, and/or routing procedures.

According to an embodiment of the present invention, compilation results from a synthesis procedure may be imported to improve the quality of design partitions. Logic synthesis information related to beneficial cross-boundary optimizations may be used to prevent creation of design partitions that may be illegal or partitions that prevent beneficial logic synthesis optimizations. Logic synthesis optimizations having significant impact on performance, power, or area used by the design may be preserved by forgoing partitions that would create boundaries prohibiting these optimizations.

At 402, cost computation data structures are updated. According to an embodiment of the present invention, a general normalized cost function F(x) is employed. The overall cost function is a sum of module costs as represented by the relationship below.

$$F(x) = \sum_{i_z} [c_i x_i + x_i'(1 - c_i)]$$

In the relationship above, $c_i$ represents a cost associated with adding a module, $x_i$, to the partition. A matching complement cost is to be defined for the compliment module in the solution space. F(x) is a non-decreasing function over the solution space. A node cost may be defined as a sum of weighted cost terms as shown below.

$$C_i(x_i) = \frac{A_1 C_{i1}(x_i) + A_2 C_{i2}(x_i) + \ldots + A_n C_{in}(x_i)}{A_1 + A_2 + \ldots + A_n}$$

According to an aspect of the present invention, $A_i$ is the weight associated with cost i, where weights are non-negative.

At 403, the cost function is evaluated to identify a next partition. According to an embodiment of the present invention, a branch-and-bound technique to greedily identify a best new partition to create is used.

At 404, if a new partition is found, control proceeds to 405. If a new partition is not found control proceeds to 406.

At 405, it is determined whether a stopping criteria has been satisfied. If the stopping criteria has been satisfied, control proceeds to 406 and control terminates the procedure. If the stopping criteria has not been satisfied, control returns to 402. According to an embodiment of the present invention, the stopping criteria may include setting a maximum number of partitions created, reaching a predetermined percentage of design added to new partitions, reaching a maximum total partition cost, or other criteria. According to one aspect of the present invention, the maximum total partition cost may be dynamically adjusted based on characteristics of the design and/or the characteristics of other partitions identified by the partitioning procedure. This promotes algorithmic convergence and prevents selection of too many partitions. This aspect also allows generation of partitions even when the design does not include good partitioning candidates.

Figure 5:
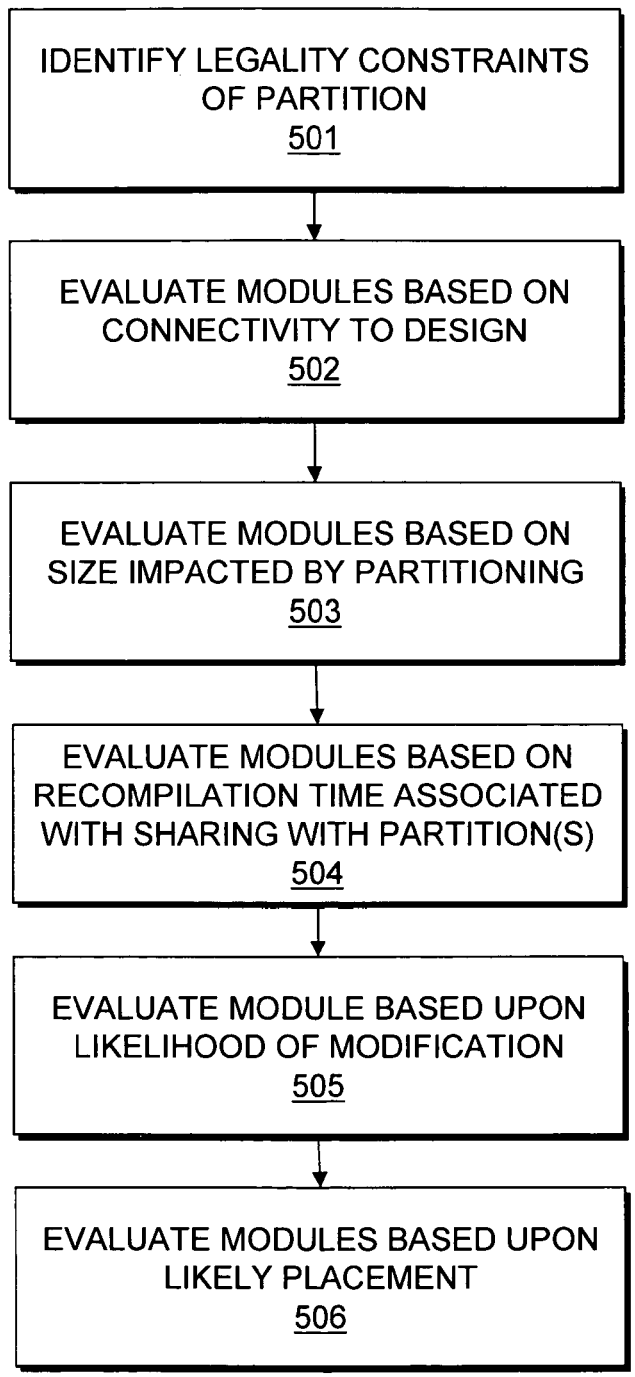
FIG. 5 is a flow chart illustrating a method for identifying a partition according to an embodiment of the present invention.

FIG. 5 is a flow chart illustrating a method for identifying a partition according to an embodiment of the present invention. According to an embodiment of the present invention, the partition is identified by imposing legality constraints and evaluating each module in the system design to determine whether to include the module in a present partition. The procedure illustrated in FIG. 5 may be used to implement procedure 403 shown in FIG. 4.

At 501, legality constraints of partitions are identified. According to an embodiment of the present invention, legality constraints are utilized to reduce a search space. The legality constraints may include minimum and maximum partition size thresholds. The legality constraints may include setting a requirement that the partition include some amount of a particular resource. This amount may be specified as a range which may be specified in absolute terms or in relative terms. The legality constraints may also include a requirement that partitions be created only at hierarchical module boundaries.

At 502, modules are evaluated based on their connectivity to the system design. According to an embodiment of the present invention, modules that isolate large portions of logic relative to the number of signals that connect to the rest of the design are identified. A cost term for a module is derived by the following relationships.

$$PartitionCost = \frac{\alpha \cdot T_{reg} + \beta T_{unreg}}{(S_{partition})^{\Omega}}$$

$T_{reg}$=Number of registered interpartition terminals
$T_{unreg}$=Number of unregistered interpartition terminals
$S_{partition}$=Size of the partition
$\alpha$ and $\beta$ are constants chosen to change the relative importance of $T_{reg}$ and $T_{unreg}$.
$\Omega$ is a constant used to change the importance of the size of partitions.

It should be appreciated that the cost term described above may be modified to make it directly timing driven. In this embodiment, the terms $T_{reg}$ and $T_{unreg}$ would be a function of the number of registered/unregistered interpartition terminals and signal criticality. When this cost term is used in isolation, it may be used to extract design regularity. Stamped HDL modules originating from the same HDL source file tend to exhibit similar size and terminal characteristics. When partitions are detected in an iterated, greedy fashion with this cost term, stamped modules have similar costs and consequently are selected in sequence.

At 503, modules are evaluated based on their size as impacted by partitioning. According to an embodiment of the present invention, modules that would derive significant benefit from cross-boundary optimizations are identified. A cost term is introduced to prevent partitions from being created that would suppress these optimizations. Highly beneficial cross-boundary optimizations may include optimizations that sweep away unconnected design logic, propagate constants, perform register retiming operations, and perform logic duplication operations. In order to evaluate cross-boundary optimizations that directly effect area minimization, the partition is synthesized twice, once with the optimization and once without the optimization. A cost term for including the module in the partition is derived as follows.

$$PartitionCost = Y\frac{S_{partition,no\_op}}{S_{partition,op}} - 1$$

$S_{partition,no\_op}$=The size of the partition
$S_{partition,op}$=Size of the partition if the boundary optimizations were permitted
Y is a constant used to scale the cost According to an embodiment of the present invention, the value $S_{partition,no\_op}$ can be approximated from a known $S_{partition,op}$ value by using the following relationship.

$$S_{partition,no\_op} = F(T_{constant}, T_{unconnected}) S_{partition,op}$$

The value $F(T_{constant}, T_{unconnected})$ can be derived by extracting benchmark results from a suite of representative FPGA modules compiled with and without boundary optimizations.

According to an embodiment of the present invention, a method to evaluate the cost of cross-boundary optimization may include 1) synthesizing logic in a partition in isolation so that cross-boundary optimizations could not occur at all, 2) resynthesizing the logic in the partition in the context of the complete design, allowing cross-boundary optimizations to occur, and 3) comparing the total amount of logic attributed to the partitions from (1) and (2).

At 504, modules are evaluated based on recompilation time associated with sharing with other partitions. Partitions that fully encapsulate all modules instantiated from a particular HDL source file result in fewer partitions that need to be recompiled when user modifications require the HDL source file to be recompiled. According to an embodiment of the present invention, modules having duplicates outside a partition that must be recompiled if the partition has an HDL source file modification are identified. A cost term for including the module in the partition is derived as follows.

$$PartitionCost = \frac{N_x}{S_{design} - S_x}$$

$S_{design}$=The size of the entire design (I.e. # nodes)
$S_x$=Size of partition X
$N_x$=The number of nodes outside of X that must be recompiled if X's source code was modified At 505, modules are evaluated based upon their likelihood of modification. According to an embodiment of the present invention, modules with HDL source files that are unlikely to be modified by a user are given preference over modules with HDL source files that are likely to be modified by a user.

At 506, modules are evaluated based upon their likely placement. According to an embodiment of the present invention, partitions are attempted to be made around modules that are placed in close proximity. A bounding box that encapsulates modules placed in close proximity is found. The bounding box is used to normalize the amount of logic placed in a region.

FIGS. 1, 4, and 5 are flow charts that illustrate embodiments of the present invention. Some of the techniques illustrated may be performed sequentially, in parallel or in an order other than that which is described and that the procedures described may be repeated. It should be appreciated that not all of the techniques described are required to be performed, that additional techniques may be added, and that some of the illustrated techniques may be substituted with other techniques.

Figure 6A:
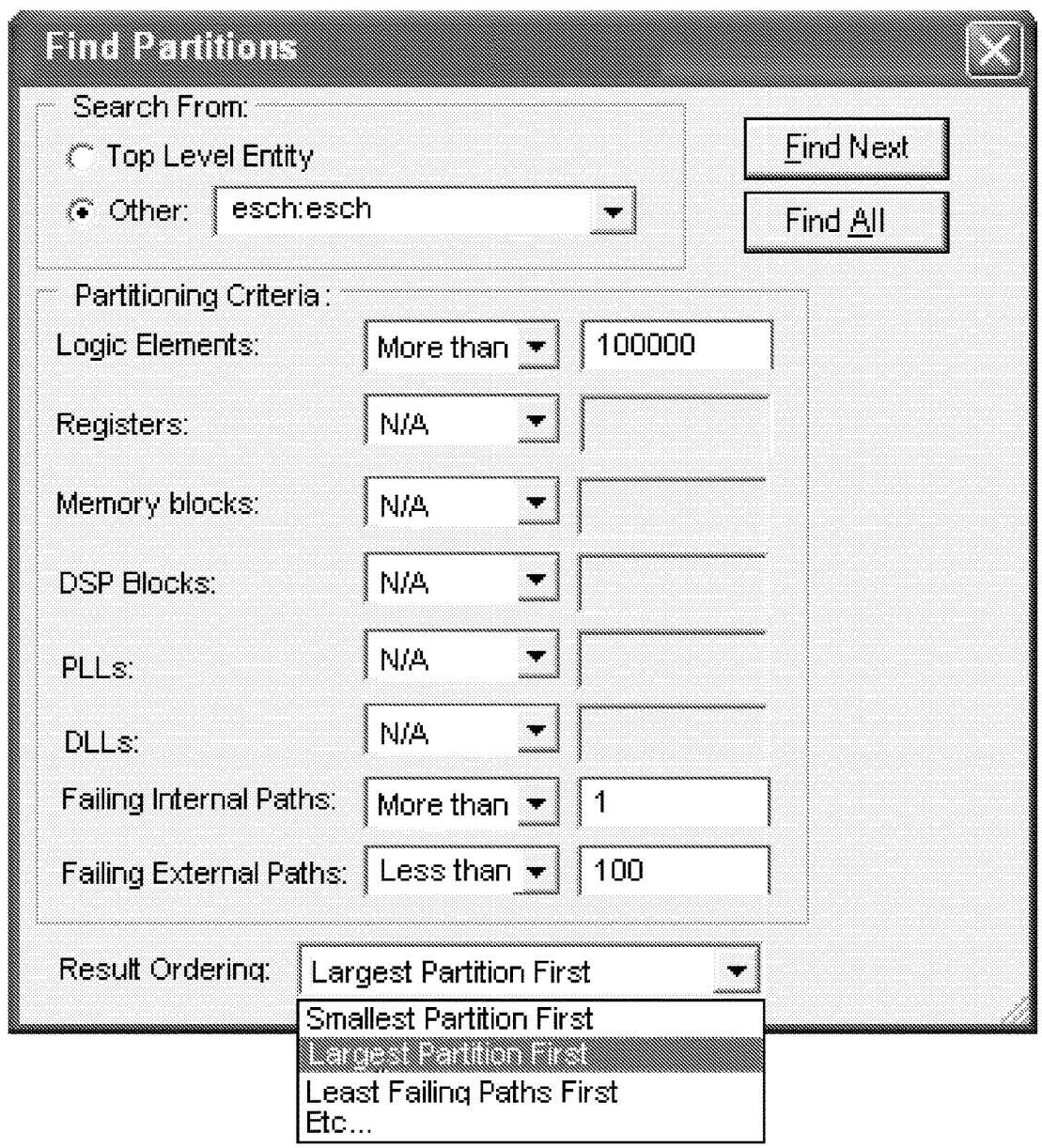
FIGS. 6a and 6b illustrate graphical user interfaces for a hierarchical design partition unit according to an embodiment of the present invention.
Figure 6B:
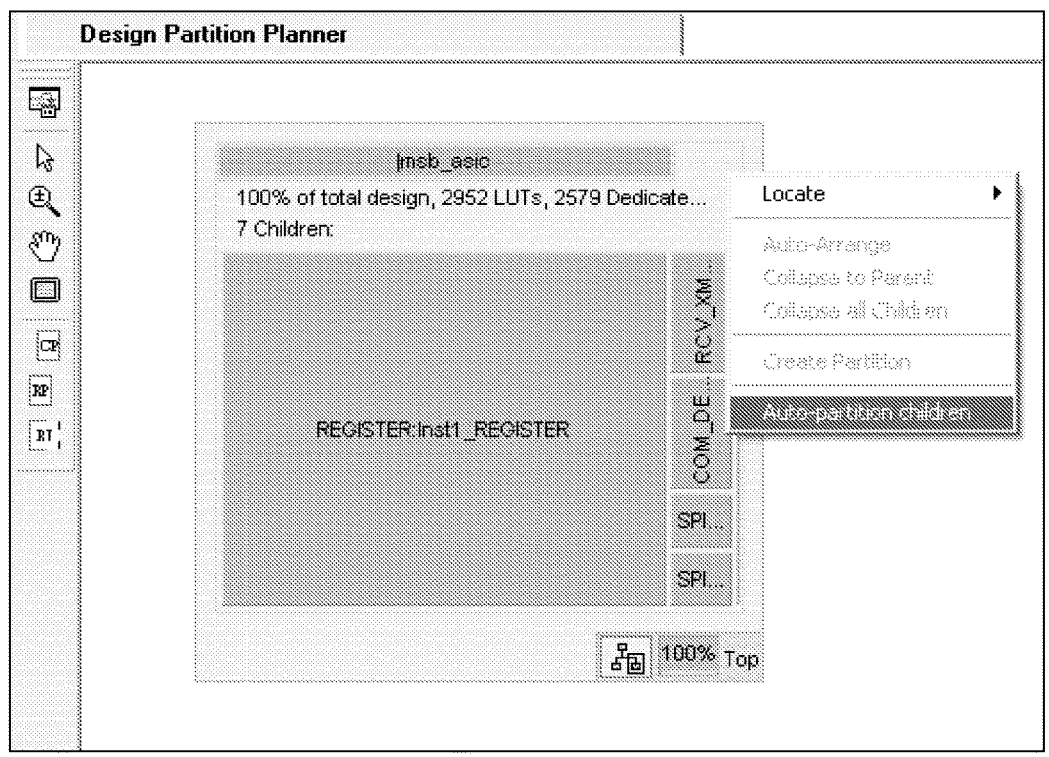

FIGS. 6a and 6b illustrate graphical user interfaces (GUIs) for a hierarchical design partition unit according to an embodiment of the present invention. The GUIs facilitate tight interaction between the EDA tool performing partitioning and a designer. The GUIs allow a designer to input to the underlying partitioning procedures which allow the designer to configure partitioning objectives. The inputs could include the size of partitions to consider, number of partitions to create, prioritizing various partitioning goals, and other criteria.

Figure 7:
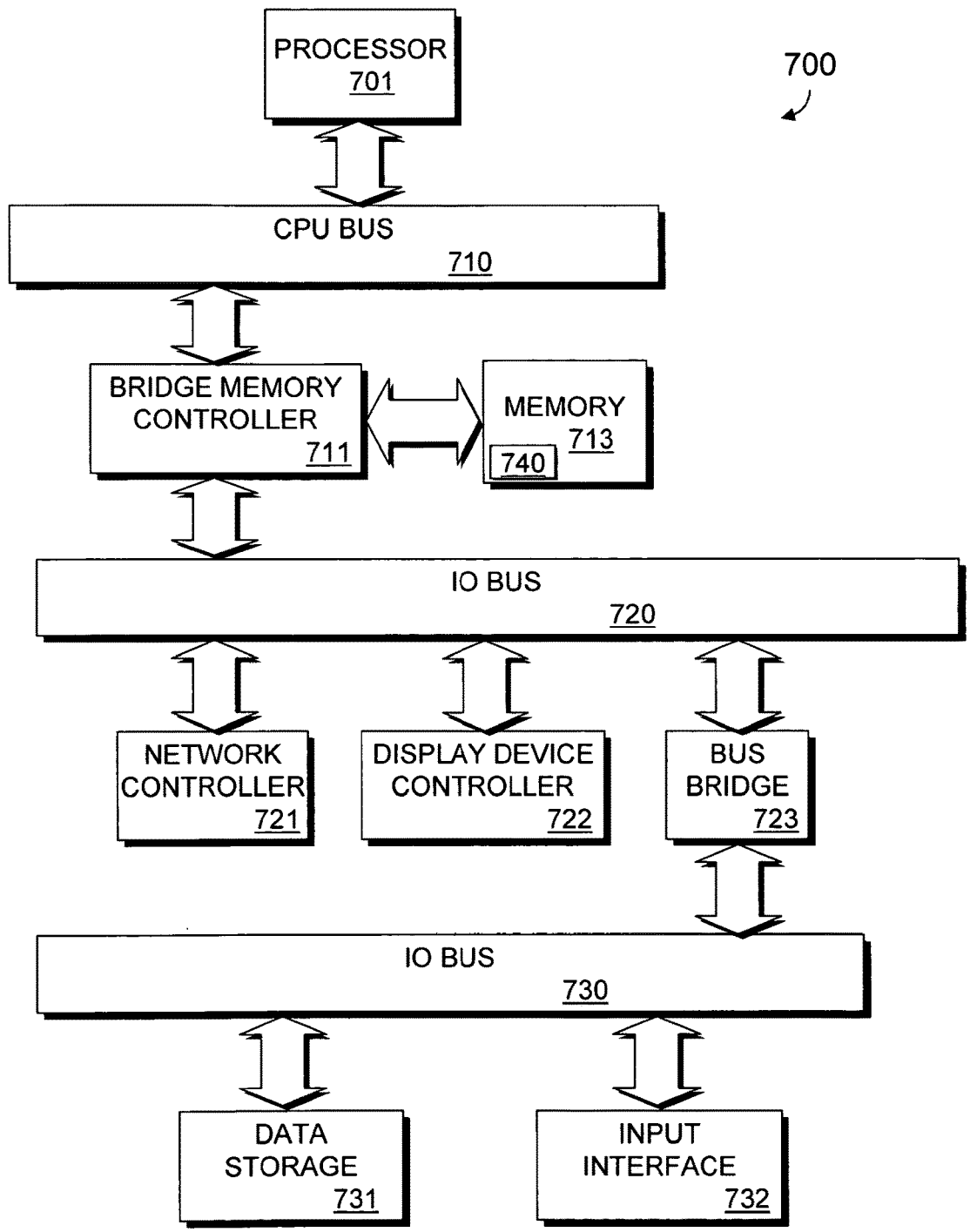
FIG. 7 is a block diagram that illustrates a computer system in which an exemplary embodiment of the invention resides.

FIG. 7 is a block diagram of an exemplary computer system 100 in which an example embodiment of the present invention resides. As shown, the computer system 700 includes a processor 701. The processor 701 is coupled to a CPU bus 710 that transmits data signals between the processor 701 and other components in the computer system 700.

The computer system 700 includes a memory 713. The memory 713 may be a dynamic random access memory device, a static random access memory device, and/or other memory device. The memory 713 may store instructions and code represented by data signals that may be executed by the processor 701. A bridge memory controller 711 is coupled to the CPU bus 710 and the memory 713. The bridge memory controller 711 directs data signals between the processor 701, the memory 713, and other components in the computer system 700 and bridges the data signals between the CPU bus 710, the memory 713, and a first IO bus 720.

The first IO bus 720 may be a single bus or a combination of multiple buses. The first 10 bus 720 provides communication links between components in the computer system 700. A network controller 721 is coupled to the first IO bus 720. The network controller 721 may link the computer system 700 to a network of computers (not shown) and supports communication among the machines. A display device controller 722 is coupled to the first 10 bus 720. The display device controller 722 allows coupling of a display device (not shown) to the computer system 700 and acts as an interface between the display device and the computer system 700.

A second IO bus 730 may be a single bus or a combination of multiple buses. The second IO bus 730 provides communication links between components in the computer system 700. A data storage device 731 is coupled to the second IO bus 730. The data storage device 731 may be a hard disk drive, a floppy disk drive, a CD-ROM device, a flash memory device or other mass storage device. An input interface 732 is coupled to the second IO bus 730. The input interface 732 allows coupling of an input device to the computer system 700 and transmits data signals from an input device to the computer system 100. A bus bridge 723 couples the first IO bus 720 to the second IO bus 730. The bus bridge 723 operates to buffer and bridge data signals between the first IO bus 720 and the second IO bus 730. It should be appreciated that computer systems having a different architecture may also be used to implement the computer system 700.

A system designer 740 may reside in memory 713 and be executed by the processor 701. The system designer 740 may operate to elaborate a system, synthesize the system, place the system on a target device, route the system, partition the system, perform incremental compilation on the system, assemble the system, and program a target device to implement the system.

Figure 8:
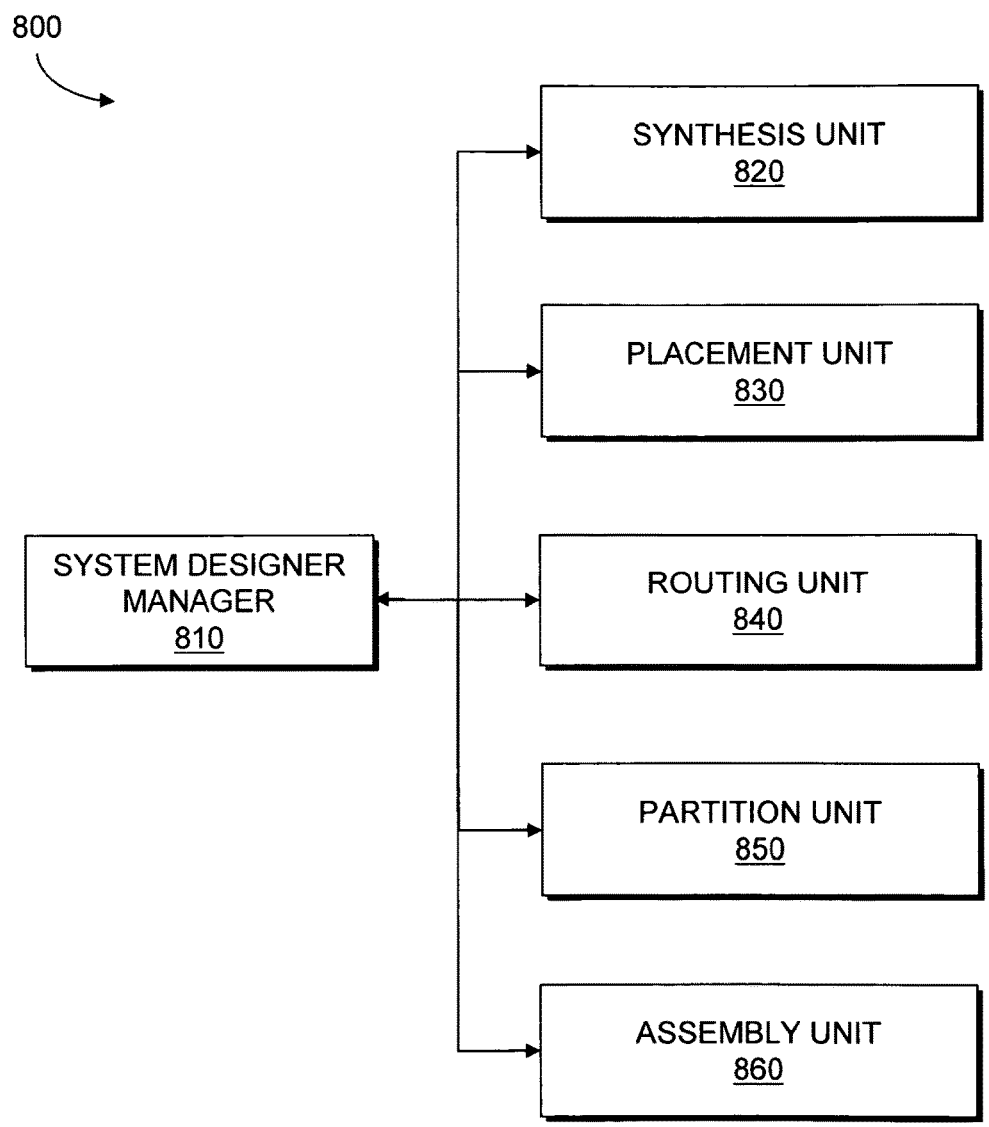
FIG. 8 is a system designer according to an exemplary embodiment of the present invention.

FIG. 8 illustrates a system designer 800 according to an exemplary embodiment of the present invention. The system designer 800 may be used to implement the system designer 840 shown in FIG. 7 and may perform the procedure described in FIG. 1. The system designer 800 may be an EDA tool for designing a system on a target device. The target device may be, for example, an ASIC, a structured ASIC, an FPGA, a programmable logic device (PLD), a printed circuit board (PCB), or other circuitry. FIG. 8 illustrates modules implementing an embodiment of the system designer 800. According to one embodiment, system design may be performed by a computer system (not shown) executing sequences of instructions represented by the modules shown in FIG. 8. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 800 includes a system designer manager 810. The system designer manager 810 is connected to and transmits data between the components of the system designer 800. The system design manager 810 may also perform elaboration on design information that is inputted into the system designer 800. Elaboration may include reviewing the design information to ensure that the syntax of the information is correct.

Block 820 represents a synthesis unit. The synthesis unit 820 generates a logic design of a system to be implemented in the target device. According to an embodiment of the system designer 800, the synthesis unit 820 takes a conceptual Hardware Description Language (HDL) design definition and generates an optimized logical representation of the system. The optimized logical representation of the system generated by the synthesis unit 820 may include a representation that has a minimized number of functional blocks and registers, such as logic gates and logic elements, required for the system. Alternatively, the optimized logical representation of the system generated by the synthesis unit 820 may include a representation that has a reduced depth of logic and that generates a lower signal propagation delay. The synthesis unit 820 also determines how to implement the functional blocks and registers in the optimized logic representation utilizing specific resources on a target device thus creating an optimized "technology-mapped" netlist. The technology-mapped netlist illustrates how the resources (components) on the target device are utilized to implement the system. In an embodiment where the target device is a FPGA, the components could be logical elements or adaptive logic modules. In an embodiment where the target device is an ASIC, the components could be gates or standard cells. In an embodiment where the target device is a structured ASIC, the technology-mapped netlist may contain components that can be implemented in the structured ASIC fabric, such as RAM blocks, multiplier blocks, and gates from a library of gates.

Block 830 represents a placement unit. The placement unit 830 places the system on to the target device by determining which components or areas on the target device are to be used for specific functional blocks and registers. According to an embodiment of the system designer 800, the placement unit 830 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 830 may utilize a cost function in order to determine a good assignment of resources on the target device.

Block 840 represents a routing unit. The routing unit 850 determines the routing resources on the target device to use to provide interconnection between the components implementing functional blocks and registers of the logic design.

Block 850 represents a partition unit. The partition unit 850 partitions/divides the system design into a plurality of logical sections. According to an embodiment of the present invention, a logical section includes one or more design modules that are grouped together, wherein a design module may include one or more components. Partitioning may be performed after elaboration, synthesis, placement or routing where partitioning utilizes information from one or more of the procedures. The partition unit 850 may partition the system design after any one of the elaboration, synthesis, placement, and routing procedures and need not wait for the routing procedure to be completed prior to performing partitioning. The partition unit 850 may optionally be coupled to a floorplanning unit (not shown) that assigns a physical location on the target device to one or more partitioned logical sections identified by the partition unit 850. It should be appreciated that the partition unit 850 and the floorplanning unit may operate together to share information and generate an optimal solution.

According to an embodiment of the present invention, the system design manager 810 may allow a designer to make a modification to the system design where one or more modules in one or more of the partitions generated by the partition unit 850 is modified. In this embodiment, incremental recompilation may be performed where elaboration, synthesis, placement, and routing are performed only on partitions that have been modified.

Block 860 is an assembly unit. The assembly unit 860 creates a data file that includes information determined by the compilation procedure performed by the system designer 800. The data file may be a bit stream that may be used to program a target device. According to an embodiment of the present invention, the data file generated may be transmitted to another computer system to allow the design of the system to be further processed. Alternatively, the data file may be transmitted to another computer system which may be used to program the target device according to the system design. By programming the target device with the data file, components on the target device are physically transformed to implement the system. It should be appreciated that the design of the system may also be output in other forms such as on a display device or other medium.

Figure 9:
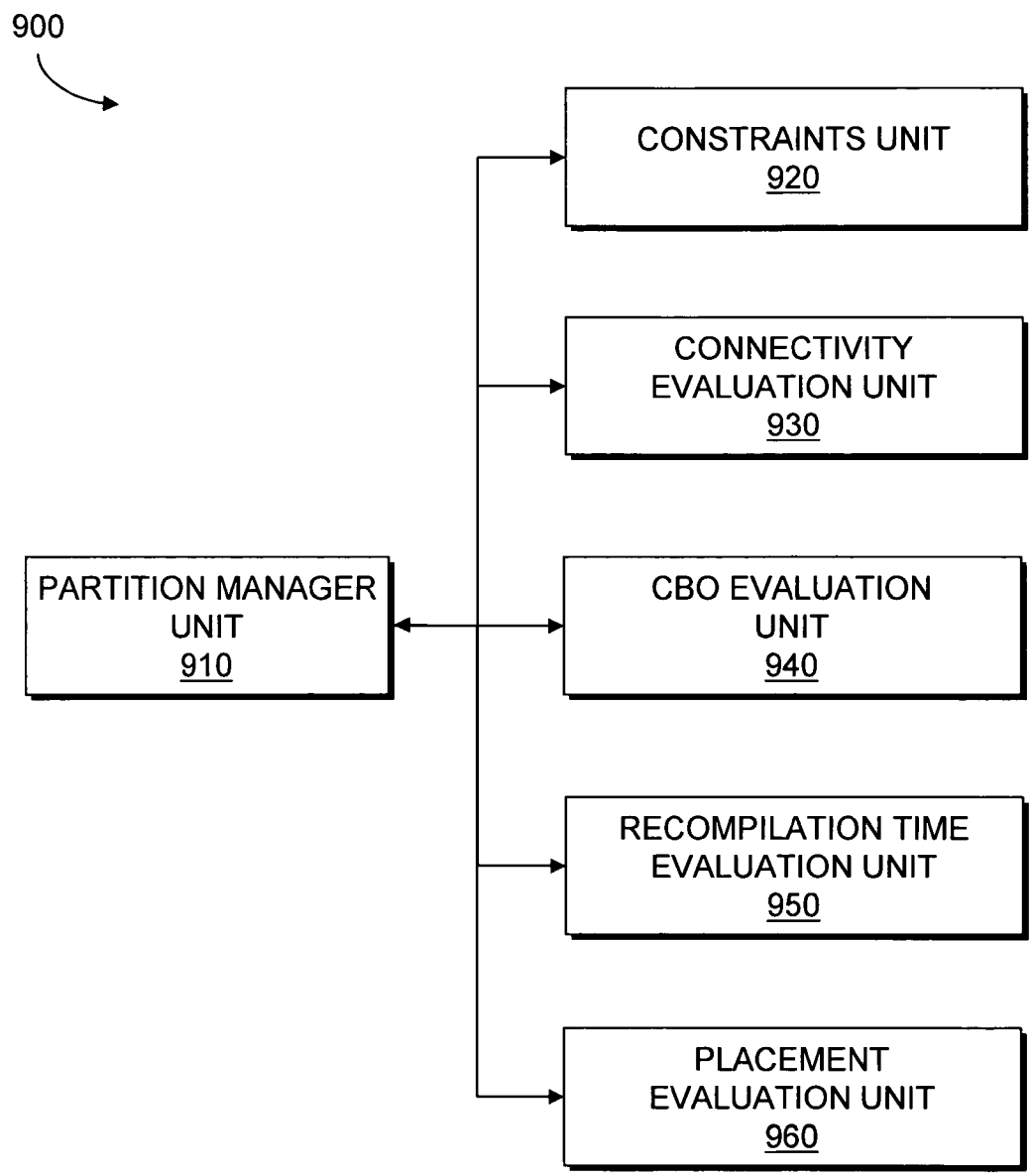
FIG. 9 is a block diagram of partition unit according to an exemplary embodiment of the present invention.

FIG. 9 is a block diagram of a partition unit 900 according to an exemplary embodiment of the present invention. The partition unit 900 may be used to implement the partition unit 850 illustrated in FIG. 8 and perform the procedure illustrated in FIG. 5. The partition unit 900 includes a partition manager unit 910. The partition manager unit 910 is connected to and transmits information between components in the partition unit 900.

Block 920 is a constraints unit. The constraints unit 920 may identify and enforce legality constraints for partitions. According to an embodiment of the present invention, legality constraints are utilized to reduce a search space. The legality constraints may include minimum and maximum partition size thresholds. The legality constraints may include setting a limit of having a particular resource in a partition as compared to an amount of the resource present in the system design or parent. The legality constraints may also include a requirement that partitions be created only at hierarchical module boundaries.

Block 930 is a connectivity evaluation unit. The connectivity evaluation unit 930 evaluates modules based on their connectivity to the system design. According to an embodiment of the present invention, modules that isolate large portions of logic relative to the number of signals that connect to the rest of the design are identified. According to an embodiment of the partition unit 900, the connectivity evaluation unit 930 takes into consideration a number of registered and unregistered interpartition terminals in a partition and the size of a partition when a module is included. The connectivity evaluation unit 930 may also take into account signal criticality.

Block 940 is a cross-boundary optimization (CBO) evaluation unit. The cross-boundary optimization evaluation unit 940 evaluates the impact of forgoing an optimization when adding a module to a partition. Highly beneficial cross-boundary optimizations may include optimizations that sweep away unconnected design logic, propagate constants, perform register retiming operations, and perform logic duplication operations. In order to evaluate cross-boundary optimizations that directly effect area minimization, the partition is synthesized twice, once with the optimization and once without the optimization and the sizes of the partition is evaluated.

Block 950 is a recompilation time evaluation unit. The recompilation time evaluation unit 950 evaluates a module based on the recompilation time associated with sharing or the module with other partitions. According to an embodiment of the present invention, modules having duplicates outside a partition that require recompilation if the partition has an HDL source file modification are identified.

Block 960 is a placement evaluation unit. The placement evaluation unit 960 attempts to partition modules such that modules that are placed in close proximity are included in the same logical section.

According to an embodiment of the present invention, the partition manager unit 910 generates partitions in the system design based upon the legality constraints enforced by and evaluation performed by the components in the partition unit 900.

Embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 10:
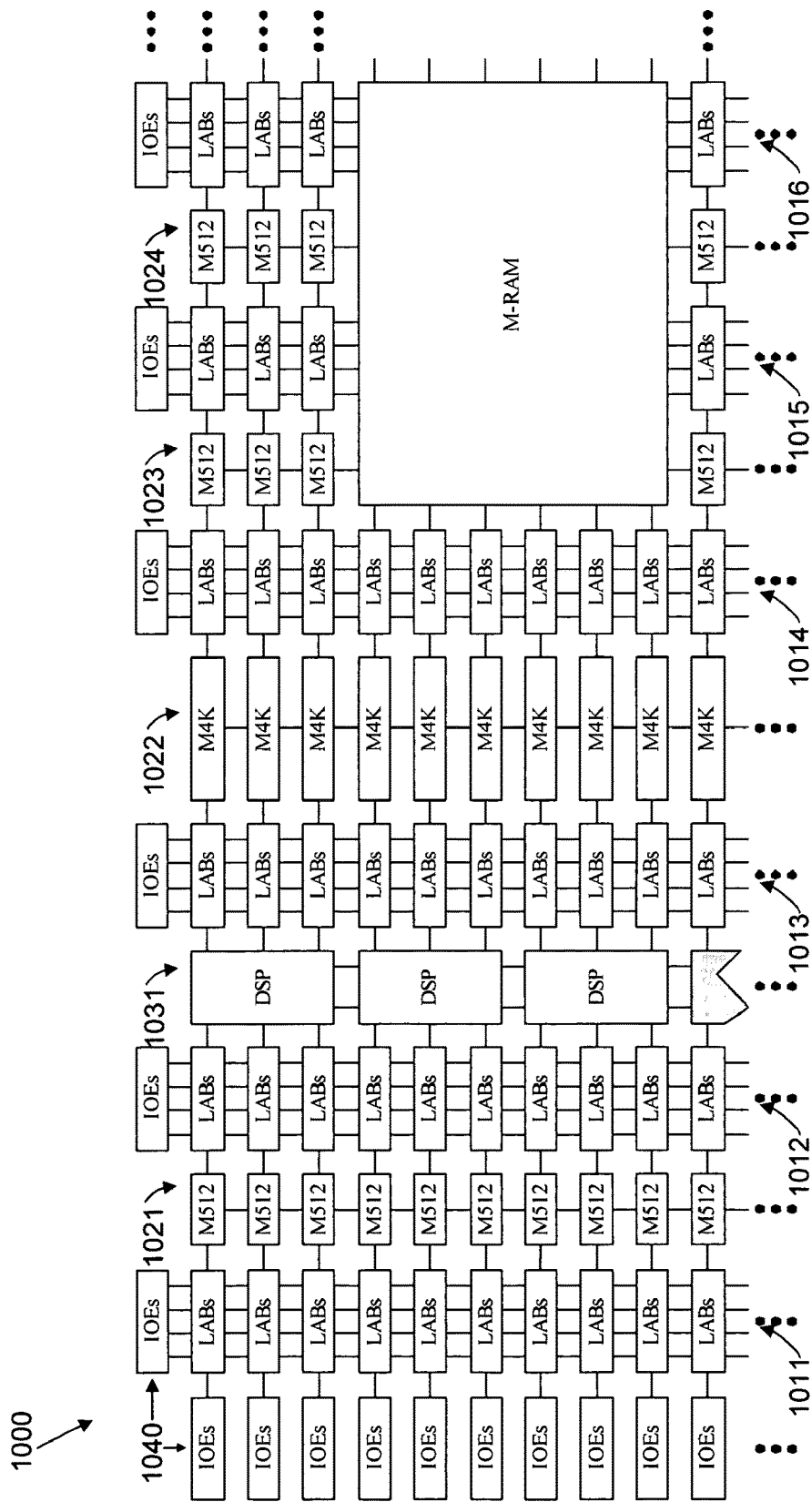
FIG. 10 illustrates a target device according to an exemplary embodiment of the present invention.

FIG. 10 illustrates a target device according to an embodiment of the present invention. The target device 1000 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input lookup table (LUT) with a configurable register. According to an alternate embodiment of the present invention, the logic block may operate similarly to an adaptive logic module (ALM), such as those found in Stratix devices manufactured by Altera Corporation. LABs are grouped into rows and columns across the target device 1000. Columns of LABs are shown as 1011-1016. It should be appreciated that the logic block may include additional or alternate components.

The target device 1000 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 1000. Columns of memory blocks are shown as 1021-1024.

The target device 1000 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 1000 and are shown as 1031.

The target device 1000 includes a plurality of input/output elements (IOEs) 1040. Each IOE feeds an IO pin (not shown) on the target device 1000. The IOEs 1040 are located at the end of LAB rows and columns around the periphery of the target device 1000. Each IOE may include a bidirectional IO buffer and a plurality of registers for registering input, output, and output-enable signals.

The target device 1000 may include routing resources such as LAB local interconnect lines, row interconnect lines ("H-type wires"), and column interconnect lines ("V-type wires") (not shown) to route signals between components on the target device.

FIG. 10 illustrates an exemplary embodiment of a target device. It should also be appreciated that, as indicated above, the target device may include the same or different semiconductor devices arranged in a different manner. The target device 1000 may also include FPGA resources other than those described and illustrated with reference to the target device illustrated in FIG. 10. Thus, while embodiments of the invention described herein may be utilized on the architecture described in FIG. 10, it should be appreciated that it may also be utilized on different architectures.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for synthesis of a circuit in a target integrated circuit (IC) device that comprises programmable logic, wherein the programmable logic comprises a set of logic sections, each logic section associated with a physical location, wherein the method comprises:
   receiving a circuit design for the target IC device, wherein the circuit design comprises at least one constraint for the target IC device;
   dividing automatically the circuit design into a set of partitions, wherein the division balances an assignment of resources of the target IC device to produce a partitioned circuit design, and wherein each partition is associated with a physical location of a respective logic section of the set of logic sections;
   generating a bit stream based on the target IC device and the partitioned circuit design; and
   programming the target IC device using the bit stream.

2. The method of claim 1, wherein dividing automatically the circuit design into the set of partitions is based on the at least one constraint for the circuit.

3. The method of claim 1, wherein the partitioned circuit design comprises a plurality of cross-boundary couplings, and wherein dividing automatically the circuit design comprises using a cost function that comprises cross-boundary optimizations.

4. The method of claim 1, wherein the target IC device comprises interconnect lines that couple at least two partitions of the set of partitions.

5. The method of claim 1, wherein dividing the circuit design comprises timing criticality information.

6. A non-transitory computer readable medium comprising instructions that, when executed by a processor, cause the processor to:
   receive a circuit design for a target integrated circuit (IC) device, wherein the circuit design comprises at least one constraint for the target IC device;
   produce a partitioned circuit design comprising a plurality of partitions based on resources of the target IC device, wherein each partition is associated with a respective physical location of the target IC device; and
   program the target IC device using a bit stream generated from the partitioned circuit design.

7. The non-transitory computer readable medium of claim 6, wherein producing the partitioned circuit design comprises using a cost function that comprises the at least one constraint for the circuit design.

8. The non-transitory computer readable medium of claim 6, wherein the target IC device comprises a plurality of cross-boundary couplings.

9. The non-transitory computer readable medium of claim 8, wherein at least one cross-boundary coupling comprises an interconnect line that couples two partitions of the plurality of partitions.

10. The non-transitory computer readable medium of claim 8, wherein producing the partitioned circuit design comprises minimizing a number of cross-boundary couplings in the plurality of cross-boundary couplings.

11. The non-transitory computer readable medium of claim 6, wherein producing the partitioned circuit design is based on timing criticality information.

12. The non-transitory computer readable medium of claim 6, wherein producing the partitioned circuit design is based on a count of resources.

13. A system comprising an integrated circuit (IC) device that comprises programmable logic circuitry programmed with a bit stream, wherein the programmable logic circuitry comprises a plurality of logic sections and wherein the bit stream was generated by a method that comprises:
   receiving a circuit design for the programmable logic circuitry, wherein the circuit design comprises at least one constraint for the IC device;
   generating the plurality of logic sections based on resources of the IC device, wherein each logic section comprises a portion of the circuit design;
   generating a partitioned circuit design by assigning each logic section of the plurality of logic sections to a respective physical location of the IC device;

generating the bit stream based on the partitioned circuit design; and programming the programmable logic circuitry with the bit stream.

14. The system of claim 13, wherein generating the plurality of logic sections is based on a cost function that comprises the at least one constraint for the circuit design.

15. The system of claim 13, comprising a plurality of cross-boundary couplings, and wherein generating the plurality of logic sections comprises identifying at least one cross-boundary coupling of the plurality of cross-boundary couplings.

16. The system of claim 15, wherein at least one cross-boundary coupling comprises an interconnect line that couples two partitions of the plurality of logic sections.

17. The system of claim 15, wherein producing the partitioned circuit design comprises minimizing a number of cross-boundary couplings in the plurality of cross-boundary couplings.

18. The system of claim 13, wherein the partitioned circuit design comprises timing criticality information.

19. The system of claim 13, wherein the generating the plurality of logic sections comprises identifying a count of resources.

20. The system of claim 13, comprising a processor coupled to the IC device.

21. The system of claim 20, comprising a printed circuit board that is coupled to the processor and the IC device.

22. The system of claim 13, wherein the IC device comprises a structured applicant-specific integrated circuit that comprises processing circuitry.

23. The system of claim 13, comprising a memory coupled to the IC device.

* * * * *